(12) United States Patent
Bazarsky et al.

(10) Patent No.: US 10,374,639 B2
(45) Date of Patent: Aug. 6, 2019

(54) ADAPTIVE BIT-FLIPPING DECODER BASED ON DYNAMIC ERROR INFORMATION

(71) Applicant: WESTERN DIGITAL TECHNOLOGIES, INC., San Jose, CA (US)

(72) Inventors: Alexander Bazarsky, Holon (IL); Eran Sharon, Rishon Lezion (IL); Omer Fainzilber, Even Yehuda (IL); Ran Zamir, Ramat Gan (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/896,440

(22) Filed: Feb. 14, 2018

(65) Prior Publication Data

US 2018/0175889 A1    Jun. 21, 2018

Related U.S. Application Data

(63) Continuation-in-part of application No. 15/408,823, filed on Jan. 18, 2017, which is a continuation-in-part of application No. 15/371,167, filed on Dec. 6, 2016.

(51) Int. Cl.
*H03M 13/00* (2006.01)
*H03M 13/37* (2006.01)
*H03M 13/43* (2006.01)
*H03M 13/11* (2006.01)
*G06F 16/901* (2019.01)

(52) U.S. Cl.
CPC .... *H03M 13/3715* (2013.01); *G06F 16/9017* (2019.01); *H03M 13/1108* (2013.01); *H03M 13/3723* (2013.01); *H03M 13/43* (2013.01); *H03M 13/6325* (2013.01)

(58) Field of Classification Search
CPC .......... H03M 13/6566; H03M 13/2906; G06F 3/0619; G06F 3/065; G06F 3/067; G06F 11/1068; G06F 11/1072; G06F 11/076; G06F 2212/403; G11C 29/52; G11C 11/5642; G11C 2211/5621;
(Continued)

(56) References Cited

U.S. PATENT DOCUMENTS 5,657,332 A   8/1997  Auclair et al.
7,823,043 B2  10/2010  Lasser
(Continued)

FOREIGN PATENT DOCUMENTS

EP    1990921 A3    5/2013

OTHER PUBLICATIONS

United States Patent Office Action for U.S. Appl. No. 15/408,823 dated Oct. 2, 2018 (6 pages).
(Continued)

*Primary Examiner* — Guerrier Merant
(74) *Attorney, Agent, or Firm* — Michael Best & Friedrich LLP

(57) ABSTRACT

A device includes a comparator configured to select a first threshold in response to a value of a variable node indicating a first logical value and to select a second threshold in response to the value of the variable node indicating a second logical value. The device also includes a variable node update circuit configured to adjust the value of the variable node in response to a number of unsatisfied check nodes associated with the variable node satisfying the selected threshold.

20 Claims, 5 Drawing Sheets

(58) Field of Classification Search
CPC ........ G11C 2029/0411; G11C 11/5685; G11C 29/028; G11C 29/021
See application file for complete search history.

(56) References Cited

U.S. PATENT DOCUMENTS

| | | |
|---|---|---|
| 7,904,793 B2 | 3/2011 | Mokhlesi et al. |
| 8,301,979 B2 | 10/2012 | Sharon et al. |
| 8,418,026 B2 | 4/2013 | D'Abreu et al. |
| 8,694,854 B1 | 4/2014 | Dar et al. |
| 8,797,668 B1 | 8/2014 | Grinchuk et al. |
| 9,128,858 B1 | 9/2015 | Micheloni et al. |
| 9,252,817 B2 | 2/2016 | Pan et al. |
| 2006/0075320 A1 | 4/2006 | Gendrier et al. |
| 2009/0199073 A1 | 8/2009 | Kanaoka et al. |
| 2010/0088575 A1 | 4/2010 | Sharon et al. |
| 2013/0305114 A1 | 11/2013 | Olcay et al. |
| 2015/0149840 A1 | 5/2015 | Alhussien et al. |
| 2015/0205664 A1 | 7/2015 | Janik et al. |
| 2015/0234706 A1 | 8/2015 | Alrod et al. |
| 2016/0092284 A1 | 3/2016 | Shur et al. |
| 2016/0142074 A1 | 5/2016 | Sham et al. |
| 2016/0191078 A1 | 6/2016 | Gilbert et al. |
| 2017/0300377 A1 | 10/2017 | Kaynak et al. |
| 2018/0032396 A1 | 2/2018 | Sharon et al. |

OTHER PUBLICATIONS

Sharon et al., "Generalized Syndrome Weights," U.S. Appl. No. 15/223,302, filed Jul. 29, 2016, 44 pages.
United States Patent Office Action for U.S. Appl. No. 15/371,167 dated Mar. 28, 2018 (16 pages).
United States Patent Office Action for U.S. Appl. No. 15/408,823 dated May 16, 2018 (15 pages).

US 10,374,639 B2

ADAPTIVE BIT-FLIPPING DECODER BASED ON DYNAMIC ERROR INFORMATION

CROSS REFERENCE TO RELATED APPLICATIONS

This application claims priority from and is a continuation-in-part application of U.S. patent application Ser. No. 15/408,823,filed on Jan. 18, 2017, which is a continuation-in-part application of U.S. patent application Ser. No. 15/371,167, filed on Dec. 6, 2016. The content of each of these applications is incorporated by reference herein in its entirety.

FIELD OF THE DISCLOSURE

The present disclosure is related to error correction code decoding.

BACKGROUND

Non-volatile data storage devices, such as embedded flash memory, have allowed for increased portability of data and software applications. Information that is read from a non-volatile data storage device is often processed by an error correction code (ECC) decoder to correct errors that may be introduced into stored data during operation of the non-volatile data storage device. One example of such an ECC decoder is a low-density parity check (LDPC) decoder. Another example is a bit-flipping ECC decoder. The bit-flipping ECC decoder is faster and uses less power than most belief propagation (BP) LDPC decoders, and thus the bit-flipping decoder is often used as a first "gear" of a "multi-gear" ECC decoder. In many situations, the bit error rate (BER) of a representation of data read from a memory is sufficiently small that a bit-flipping ECC decoder is able to decode the representation of data without using more powerful decoders, such as a BP LDPC decoder.

The bit-flipping ECC decoder may use a single set of thresholds when determining whether to "flip" a particular bit (e.g., to set a bit having a logical "0" value to a logical "1" value or to set a bit having a logical "1" value to a logical "0" value) during a decoding process. The single set of thresholds is based on a fixed model of a channel (e.g., between a controller and the memory). However, as memory fabrication processes decrease in size and as three-dimensional (3D) stacking of memory dies becomes more common, variance within memory dies, blocks, or pages increases. The increasing variability results in errors associated with some dies, blocks, or pages diverging from a single underlying model. This divergence can reduce correction capability and increase latency and power consumption of a bit-flipping ECC decoder.

DETAILED DESCRIPTION

Figure 1:
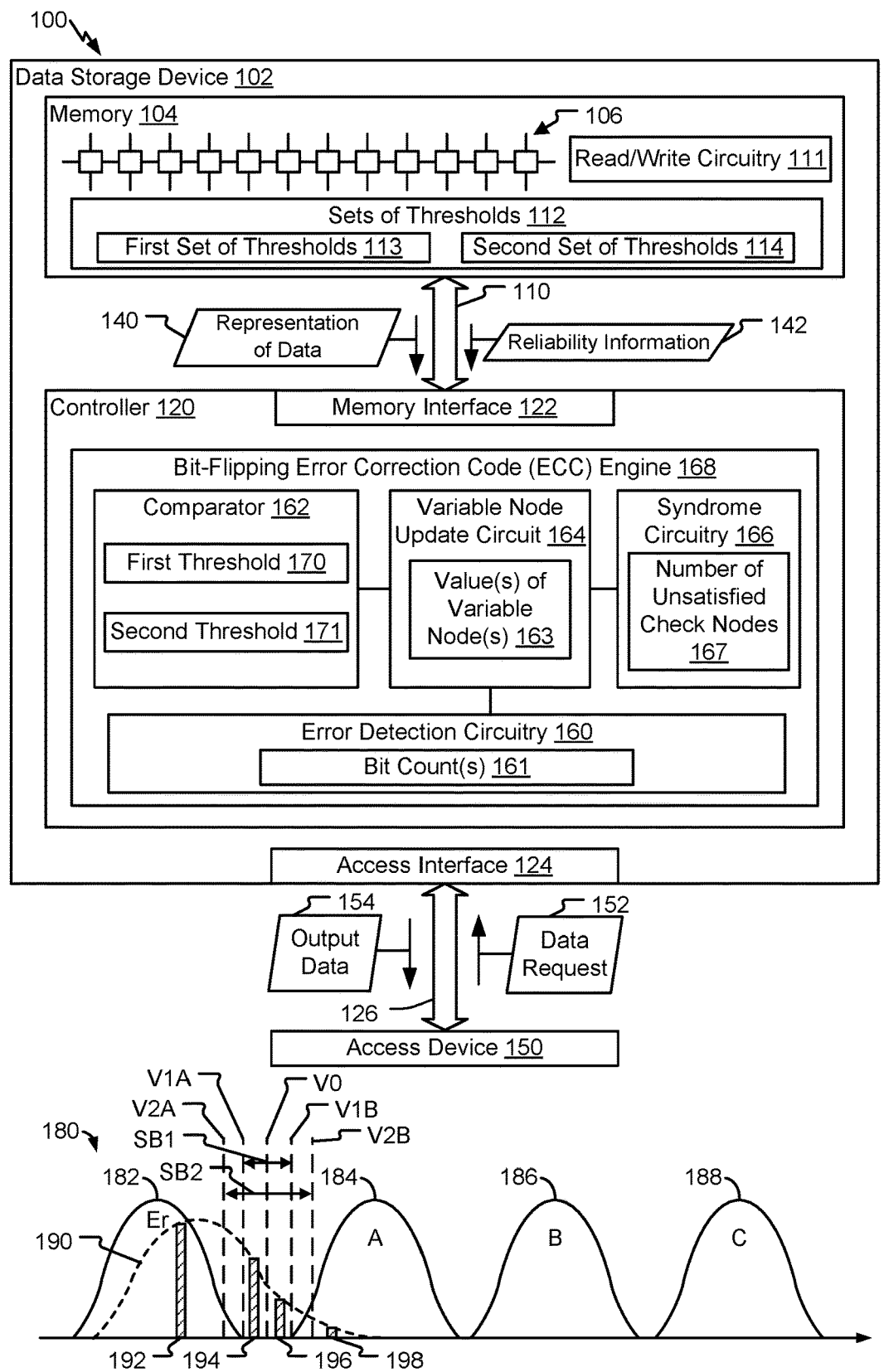
FIG. 1 is a block diagram of an illustrative example of a system including a device configured to select a bit-flipping threshold based on parameters associated with a representation of data read from a memory.

Particular implementations are described with reference to the drawings. In the description, common features are designated by common reference numbers throughout the drawings. As used herein, various terminology is used for the purpose of describing particular implementations only and is not intended to be limiting. For example, the singular forms "a," "an," and "the" are intended to include the plural forms as well, unless the context clearly indicates otherwise. It may be further understood that the terms "comprise," "comprises," and "comprising" may be used interchangeably with "include," "includes," or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

In the present disclosure, terms such as "determining", "calculating", "shifting", "adjusting", etc. may be used to describe how one or more operations are performed. It should be noted that such terms are not to be construed as limiting and other techniques may be utilized to perform similar operations. Additionally, as referred to herein, "generating", "calculating", "using", "selecting", "accessing", and "determining" may be used interchangeably. For example, "generating", "calculating", or "determining" a parameter (or a signal) may refer to actively generating, calculating, or determining the parameter (or the signal) or may refer to using, selecting, or accessing the parameter (or signal) that is already generated, such as by another component or device.

Bit-flipping error correction code (ECC) decoders may be used to decode a representation of data (e.g., a codeword) read from a memory of a data storage device. The bit-flipping ECC decoder uses a single set of thresholds for determining when to flip bits during a decoding process. To illustrate, the single set of thresholds includes one or more thresholds, each threshold associated with a corresponding clock cycle of a bit-flipping ECC decoder clock. A combination of variable nodes and check nodes may be generated based on the representation of data and further based on a code used to encode the representation of data. Each threshold represents a minimum number of unsatisfied check nodes connected to a variable node that cause a value of a bit corresponding to the variable node to be "flipped" (i.e., a bit having a logical "0" value is assigned a logical "1" value, or a bit having a logical "1" value is assigned a logical "0" value) during the decoding process. During a particular clock cycle of the decoding processes, a particular subset of variable nodes is processed. For each variable node of the particular subset, a number of unsatisfied check nodes connected to the variable node is determined. If the number satisfies (e.g., exceeds) the threshold corresponding to the particular clock cycle, a value of a bit of a representation of data that corresponds to the variable node is flipped. If the number fails to satisfy the threshold, the value of the bit remains the same. The single set of thresholds is based on a fixed channel model. However, due to variance between memory dies, blocks, or pages, actual errors may diverge from an expected error profile that is based on the fixed channel model. Divergence from the expected error profile can decrease correction capability and increase latency and power consumption of the bit-flipping ECC decoder.

The present disclosure describes systems, devices, and methods for selecting thresholds for use by a bit-flipping ECC decoder based on various parameters, such as logical values, error counts, and counts of particular bits, associated with at least one already decoded representation of data (or portion thereof). The thresholds may be selected for use in determining when to flip bits of the representation of data. Dynamically selecting thresholds based on actual error counts (e.g., measured or counted error counts) associated with decoded data may improve performance of decode operations on other representations of data (or portions thereof) as compared to using a fixed set of thresholds during all decoding processes.

To illustrate, a device includes a comparator configured to select a first threshold in response to a value of a variable node indicating a first logical value and to select a second threshold in response to the value of the variable node indicating a second logical value. The variable nodes and the check nodes may be determined or generated based on a representation of data read from a memory and further based on a code used to encode the data. The device also includes a variable node update circuit configured to adjust the value of the variable node in response to a number of unsatisfied check nodes associated with the variable node satisfying the threshold. The comparator and the variable node update circuit may be integrated in a bit-flipping ECC decoder. Thus, the bit-flipping ECC decoder may enable different thresholds to be selected for bits (corresponding to variable nodes) that have different values. The thresholds may be further selected based on error counts or other bit counts, such as "Hard Errors" (HEs) and "Unreliable Correct" (URC) bits associated with an already decoded codeword (or portion thereof). Although "counts" of errors or other bit counts are used for purpose of explanation, it should be understood that other measures may be used instead of "counts." For example, an error count may be replaced by an error rate (e.g., an error count divided by a total number of bits).

If errors are asymmetric by logical value (e.g., if bits having a logical "1" value have a higher bit error rate (BER) than bits having a logical "0" value), the comparator may select a first threshold from a first set of thresholds to determine whether to flip a variable node (e.g., a bit) that has a logical "0" value. However, if the variable node is instead associated with a logical "1" value, the comparator may select a second threshold from a second set of thresholds to determine whether to flip the bit. Because bits having the logical "1" value have more errors (e.g., are associated with a higher BER), the second set of thresholds may include lower thresholds than the first set of thresholds. The particular threshold selected from a set of thresholds may be based on a clock cycle of the bit-flipping ECC decoder, as further described herein. After selecting the threshold, the selected threshold may be used to determine whether to flip bits during a decoding process, as further described herein. In this manner, the asymmetry of the measured errors (e.g., based on logical value) is reflected in the different thresholds that are selected by the bit-flipping ECC decoder. Selecting the thresholds based on the actual (e.g., measured) error data enables flipping of bits that are more likely to be incorrect, which reduces the latency and power consumption of a bit-flipping ECC decoder in addition to improving the decoding capability, as compared to a bit-flipping ECC decoder that uses a fixed set of thresholds regardless of measured error data.

In some implementations, the thresholds (or sets of thresholds) may be selected based on the logical values, the error counts, and reliability information. For example, reliability information, such as soft bits, may be determined that indicate whether or not corresponding bit values are reliable. Different thresholds may be selected based on error counts and bit counts associated with the different logical values and different reliability values, such as HE counts, URC bit counts, unreliable error (URE) counts, etc. For example, different sets of thresholds may be selected for bits that have a logical "0" value and are indicated as reliable, bits that have a logical "0" value and are indicated as unreliable, bits that have a logical "1" value and are indicated as reliable, and bits that have a logical "1" value and are indicated as unreliable, as further described herein. Selecting thresholds at this finer level of granularity improves the correction capability and reduces the latency and power consumption of the bit-flipping ECC decoder.

FIG. 1 illustrates a system 100 that is configured to select a bit-flipping threshold based on parameters associated with a representation of data read from a memory. The system 100 includes an access device 150 and a data storage device 102. The access device 150 is coupled to the data storage device 102 via a communication path 126. The communication path 126 may be a bus or a wireless connection, as non-limiting examples. The data storage device 102 may include an access interface 124 that enables communication via the communication path 126, such as when the access interface 124 is communicatively coupled to the access device 150.

The access device 150 may include a memory interface (not shown) and may be configured to communicate with the data storage device 102 via the memory interface to read data from and write data to one or more memories of the data storage device 102. For example, the access device 150 may operate in compliance with a Joint Electron Devices Engineering Council (JEDEC) industry specification, such as a Universal Flash Storage (UFS) Access Controller Interface specification. As other examples, the access device 150 may operate in compliance with one or more other specifications, such as a Secure Digital (SD) Access Controller specification, as an illustrative, non-limiting example. The access device 150 may communicate with the one or more memories in accordance with any other suitable communication protocol.

The access device 150 may include a processor and a memory. The memory may be configured to store data and/or instructions that are executable by the processor. The memory may be a single memory or may include multiple memories, such as one or more non-volatile memories, one or more volatile memories, or a combination thereof. The access device 150 may issue one or more commands to the data storage device 102, such as one or more requests to erase data, read data from, or write data to the data storage device 102. For example, the access device 150 may be configured to provide data to be stored at the data storage device 102 or to request data to be read from the data storage device 102. The access device 150 may include a mobile telephone, a music player, a video player, a gaming console, an electronic book reader, a personal digital assistant (PDA), a computer, such as a laptop computer or notebook computer, a network computer, a server, any other electronic device, or any combination thereof, as illustrative, non-limiting examples.

The data storage device 102 includes a memory 104 and a controller 120. In some implementations, the data storage device 102 may include a memory device that includes one or more memory dies (e.g., one memory die, two memory dies, eight memory dies, or another number of memory dies). The memory 104 may be a non-volatile memory that includes one or more storage elements 106. For example, the memory 104 may include a flash memory (e.g., a NAND flash memory, a NOR flash memory, etc.), a resistive random access memory (ReRAM), or a phase change memory (PCM), as illustrative, non-limiting examples. In some implementations, the memory 104 may include or correspond to a memory die of the data storage device 102. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may store data in multiple regions that include one or more storage elements 106 (e.g., memory cells). The one or more storage elements 106 may be configured to store data. For example, each storage element of the one or more storage elements 106 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level cell (SLC) word line, a multi-level cell (MLC) word line, or as a tri-level cell (TLC) word line, as non-limiting examples. SLC data may be stored as a single bit per storage element, and MLC data may be stored as multiple bits per storage element.

The memory 104 may include support circuitry, such as read/write circuitry 111, to support operation of one or more memory dies of the memory 104. For example, the read/write circuitry 111 may include one or more buffers, drivers, or other circuitry used to perform read operations, write operations, or both, at the memory 104. The read/write circuitry 111 may be a single component or may be divided into separate components of the memory 104, such as read circuitry and write circuitry. The read/write circuitry 111 may be external to the one or more dies of the memory 104. Alternatively, one or more individual memory dies of the memory 104 may include corresponding read/write circuitry 111 that is operable to read data from and/or write data to storage elements within the individual memory die independent of any other read and/or write operations at any of the other memory dies. In some implementations, the read/write circuitry 111 is configured to perform read operations based on adjusted read parameters, as further described herein.

In a particular implementation, the memory 104 is configured to store multiple sets of thresholds 112. The multiple sets of thresholds 112 may include a first set of thresholds 113 and a second set of thresholds 114. The multiple sets of thresholds 112 may be used by the controller 120 during bit-flipping ECC decoding operations, as further described herein. In a particular implementation, the multiple sets of thresholds 112 are stored at a dedicated portion of the memory 104. Additionally, or in the alternative, one or more of the multiple sets of thresholds 112 may be read by the controller 120 and stored at a memory of the controller 120, such as a controller memory, for use during the bit-flipping ECC decode operations described herein. In a particular implementation, the multiple sets of thresholds 112 are generated and stored at the memory 104 prior to the data storage device 102 being provided to users. In other implementations, the multiple sets of thresholds 112 are generated during operation of the data storage device 102, as further described herein, and are not stored at the memory 104, or are stored after initially being generated.

The controller 120 is coupled to the memory 104 via a bus 110, an interface (e.g., interface circuitry, such as a memory interface 122), another structure, or a combination thereof. For example, the bus 110 may include one or more channels to enable the controller 120 to communicate with a single memory die of the memory 104. As another example, the bus 110 may include multiple distinct channels to enable the controller 120 to communicate with each memory die of the memory 104 in parallel with, and independently of, communication with other memory dies of the memory 104.

The controller 120 is configured to receive data and instructions from the access device 150 and to send data to the access device 150. For example, the controller 120 may send data to the access device 150 via the access interface 124, and the controller 120 may receive data from the access device 150 via the access interface 124. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 is also configured to send a read command to the memory 104 to cause read data to be sent from the memory 104 to the controller 120. The read command may specify a physical address of a portion of the memory 104 (e.g., a physical address of a word line of the memory 104). The read data may include a representation of data stored at the memory 104 and reliability information, as further described herein. The controller 120 may also be configured to send data and commands to the memory 104 associated with background scanning operations, garbage collection operations, wear leveling operations, relocation operations, etc., as illustrative, non-limiting examples.

The controller 120 includes a bit-flipping error correction code (ECC) engine 168. In some implementations, the controller 120 further includes another type of ECC engine. For example, the bit-flipping ECC engine 168 may be a first "gear" of a "multi-gear" ECC engine that includes one or more additional types of ECC engines. The bit-flipping ECC engine 168 (or the other type of ECC engine) is configured to receive data to be stored at the memory 104 and to generate a codeword. For example, the bit-flipping ECC engine 168 (or the other type of ECC engine) may include an encoder configured to encode data using an ECC scheme, such as a Reed-Solomon encoder, a Bose-Chaudhuri-Hocquenghem (BCH) encoder, a low-density parity check (LDPC) encoder, a Turbo Code encoder, an encoder configured to encode one or more other ECC encoding schemes, or a combination thereof, as illustrative, non-limiting examples. In a particular implementation, the encoder includes a LDPC encoder. The codeword may be sent (e.g., transmitted) from the controller 120 to the memory 104 and stored at the one or more storage elements 106.

The bit-flipping ECC engine 168 may also be configured to receive data and to process the received data in accordance with a bit-flipping ECC decoding scheme. For example, the bit-flipping ECC engine 168 may include one or more decoders configured to decode the received data to detect and correct, up to an error correction capability of the ECC scheme, any bit errors that may be present in the data. To illustrate, the representation of data read from the memory 104 may include a representation of codeword that may differ from the originally stored codeword due to one or more bit errors that have occurred at the memory 104 (e.g., due to a cosmic ray or other disturb event), and the decoder(s) may be configured to decode the codeword in accordance with an ECC scheme to generate decoded data (e.g., output data). As another example, the representation of data may include a representation of a portion of a codeword that is independently decodable, and the decoder may be configured to decode the portion of the codeword in accordance with an ECC scheme to generate decoded data (e.g., output data or data used to generate output data). In a particular implementation, the data is encoded in accordance with a LDPC encoding scheme (associated with a plurality of variable nodes and a plurality of check nodes), and the bit-flipping ECC engine 168 is configured to perform bit-flipping decoding operations based on the LDPC encoding scheme to decode the data read from the memory 104. The decoded data may be provided to the access device 150, for example in response to a read command from the access device 150.

The bit-flipping ECC engine 168 may receive a representation of data 140 and reliability information 142 from the memory 104. For example, the controller 120 may issue a read command to the memory 104, and the controller 120 may receive a representation of data 140 (e.g., hard bits) stored at an address indicated by the read command and reliability information 142 associated with the representation of data 140. The representation of data 140 may include one or more bits that are determined based on threshold voltages of the one or more storage elements 106, in a particular implementation. The one or more bits are referred to as hard bits. In some implementations, the representation of data 140 includes multiple independently decodable portions. In some other implementations, the representation of data 140 may be decoded by performance of separate decode operations on multiple portions of the representation of data. As used herein, portions of a representation of data refer to portions that are encoded during performance of encode operations or portions that are used during performance of separate decode operations.

The reliability information 142 may include one or more soft bits. Each soft bit may correspond to a hard bit and may indicate a reliability of the corresponding hard bit. For example, a first value of a soft bit (e.g., a logical "1" value) may indicate that the corresponding hard bit has a low reliability level (e.g., that the corresponding hard bit is indicated as unreliable), and a second value of the soft bit (e.g., a logical "0" value) may indicate that the corresponding hard bit has a high reliability level (e.g., that the corresponding hard bit is indicated as reliable). In a particular implementation, the reliability information 142 includes a single set of soft bits. In an alternate implementation, the reliability information 142 includes multiple sets of soft bits, and each set of soft bits may be determined by reading the one or more storage elements 106 using different soft bit delta values. As described further herein, a soft bit delta value indicates a difference between a read threshold (e.g., a first read voltage associated with determining the hard bits) and a second read voltage associated with determining the soft bits.

Histogram 180 in FIG. 1 may correspond to threshold voltages that can be programmed at the memory 104. In the histogram 180, each abscissa indicates threshold voltages of storage elements of the memory 104, and each ordinate indicates a number of storage elements of the memory 104 having a particular threshold voltage. The storage elements may correspond to the one or more storage elements 106.

The histogram 180 includes an erase state distribution 182, an "A" state distribution 184, a "B" state distribution 186, and a "C" state distribution 188. The erase state distribution 182, the "A" state distribution 184, the "B" state distribution 186, and the "C" state distribution 188 may be associated with a particular lower page (LP) bit value and a particular upper page (UP) bit value. For example, the erase state distribution 182 may correspond to a "11" state, the "A" state distribution 184 may correspond to a "01" state, the "B" state distribution 186 may correspond to a "00" state, and the "C" state distribution 188 may correspond to a "10" state. The threshold voltages can be sensed by applying one or more read thresholds (e.g., read voltages) to storage elements of the memory 104, such as by applying a read threshold V0.

Additionally, soft bits may be sensed by applying one or more other read voltages that differ from the read threshold V0. The soft bit read voltages may be selected to correspond to state overlap regions (e.g., regions where one state distribution may overlap another state distribution). For example, in an implementation in which the reliability information 142 includes first soft bits and second soft bits, the first soft bits may be sensed by application of read voltages and may indicate storage elements having threshold voltages within a range SB1 between V1A and V1B, and the second soft bits may be sensed by application of read voltages and may indicate storage elements having threshold voltages within a range SB2 between V2A and V2B, as non-limiting examples. A soft bit delta value corresponds to the difference between an upper (or lower) read voltage for soft bit values and the read threshold. For example, the soft bit delta value SBΔ1, corresponding to the range SB1, is equal to V1B-V0 (or V0-V1A). Thus, the range SB1 is defined as the range from read threshold—SBΔ1 to read threshold +SBΔ1. As another example, the soft bit delta value SBΔ2, corresponding to the range SB2, is equal to V2B-V0 (or V0-V2A).

The bit-flipping ECC engine 168 includes error detection circuitry 160, a comparator 162, a variable node update circuit 164, and syndrome circuitry 166. The variable node update circuit 164 is coupled to the error detection circuitry 160, the comparator 162, and the syndrome circuitry 166. The error detection circuitry 160 may be configured to process data read from the memory 104 and to determine one or more bit counts 161 (e.g., error counts and counts of particular bits) based on the data. To illustrate, the bit-flipping ECC engine 168 may decode a codeword and, during the decoding, the error detection circuitry 160 may determine the one or more bit counts 161 based on the codeword. For example, the error detection circuitry 160 may be configured to determine a "Total Error" (TE) count representative of a total number of bits of the codeword that are estimated to be erroneous, a "Hard Error" (HE) count representative of a number of bits of the codeword that are estimated to be erroneous and are and that are indicated as reliable, and an "Unreliable Correct" (URC) bit count representative of a number of bits of the codeword that are estimated to be correct and that are indicated as unreliable. The bit counts 161 may be determined for bits having different logical values. For example, the bit counts 161 may include at least a total count of erroneous bits (e.g., a TE count), a first count of erroneous bits having a first logical value (e.g., a first HE count), and a second count of erroneous bits having a second logical value (e.g., a second HE count). In some implementations, the bit counts 161 may also include a third count of unreliable correct bits having the first logical value (e.g., a first URC bit count) and a fourth count of unreliable correct bits having the second logical value (e.g., a second URC bit count). The bit counts 161 may be used to select a threshold for use in decoding the representation of data 140, as further described herein. Although the error detection circuitry 160 is described as determining the bit counts 161 based on another codeword (e.g., a previous codeword), in other implementations, the bit counts 161 may be determined based on a first portion of the representation of data 140 and used to decode a second portion of the representation of data 140.

The HE count may track the number of hard bits that are erroneous and are associated with one or more soft bits having a particular value (or a threshold number of soft bits having the particular value) that indicates that the hard bits are reliable, and the URC bit count may track the number of hard bits that are correct and are associated with one or more soft bits having a second particular value (or a threshold number of soft bits having the second particular value) that indicates that the hard bits are unreliable. In some implementations, the error detection circuitry 160 may also be configured to determine an "Unreliable Error" (URE) count representative of a number of bits of the portion that are incorrect and are indicated as unreliable, and a "Reliable Correct" (RC) bit count representative of a number of bits of the portion that are correct and are indicated as reliable.

To illustrate various bit counts, reference is made to the histogram 180. The histogram 180 also illustrates an erase state distribution 190 that is associated with a higher number of errors than the erase state distribution 182. For example, threshold voltage distribution of erased cells (e.g., storage elements) in the erase state distribution 190 may "stretch" into the "A" state distribution 184. Cells having threshold voltages located within a first region 192 of the erase state distribution 190 may store correct data and may be indicated as reliable (e.g., bits stored in these cells may be represented by the RC bit count). Cells having threshold voltages located within a second region 194 of the erase state distribution 190 may be correct and may be indicated as unreliable (e.g., bits stored in these cells may be represented in the URC bit count). Cells having threshold voltages located within a third region 196 of the erase state distribution 190 may be erroneous and may be indicated as unreliable (e.g., bits stored in these cells may be represented in the TE count and the URE count). Cells having threshold voltages located within a fourth region 198 of the erase state distribution 190 may be erroneous and may be indicated as reliable (e.g., bits stored in these cells may be represented in the TE count and the HE count).

The error detection circuitry 160 may be configured to determine one or more of the above-described bit counts during performance of a decode operation on a representation of data by the bit-flipping ECC engine 168. For example, the error detection circuitry 160 may be configured to determine the bit counts 161 (e.g., a TE count, a HE count, and a URC count, or error rates based on the counts) as part of a decode operation performed on a codeword (or a portion thereof). The error detection circuitry 160 may be configured to provide the bit counts 161 to the variable node update circuit 164. For example, error detection circuitry 160 may generate a message or data packet that includes or indicates the bit counts 161, and the error detection circuitry 160 may send the message (or data packet) to the variable node update circuit 164.

The comparator 162 is configured to select a threshold based on one or more parameters for use in decoding one or more codewords from the memory 104. The decoding operation may be a bit-flipping decoding operation that is performed by the bit-flipping ECC engine 168. To illustrate, the bit-flipping ECC engine 168 may be configured to associate each bit of the representation of data 140 with a corresponding variable node of a plurality of variable nodes during a decode operation. Each variable node may be connected to one or more check nodes based on the code used to encode the data, and each check node may be satisfied or unsatisfied during the decoding process. The comparator 162 may be configured to compare a value of a variable node 163 (e.g., a value of a corresponding bit of the representation of data 140) to a particular logical value (e.g., a logical "0" value or a logical "1" value) to determine whether the value of the variable node matches the particular logical value. Based on the result, the comparator 162 may select a threshold. For example, the comparator 162 may be configured to select a first threshold 170 in response to the value of the variable node 163 indicating a first logical value (e.g., a logical "0" value) and to select a second threshold 171 in response to the value of the variable node 163 indicating a second logical value (e.g., a logical "1" value). The first threshold 170 may be selected from the first set of thresholds 113 and the second threshold 171 may be selected from the second set of thresholds 114, as further described herein. The comparator 162 may be further configured to provide the first threshold 170 or the second threshold 171 to the variable node update circuit 164.

The syndrome circuitry 166 is configured to determine, for each particular variable node of a plurality of variable nodes, a number of unsatisfied check nodes associated with the particular variable node. For example, for the plurality of variable nodes corresponding to the representation of data 140, the syndrome circuitry 166 may determine the number of unsatisfied check nodes corresponding to each variable node. In a particular implementation, the syndrome circuitry 166 is configured to determine a bitwise syndrome vector based on the representation of data 140, and each element of the bitwise syndrome vector indicates the number of unsatisfied check nodes associated with a corresponding variable node (e.g., a corresponding bit of the representation of data 140). The number of unsatisfied check nodes for each variable node may be provided from the syndrome circuitry 166 to the variable node update circuit 164.

The variable node update circuit 164 is configured to adjust the value of the variable node 163 in response to a number of unsatisfied check nodes associated with the variable node satisfying the selected threshold. For example, if the first threshold 170 is selected (e.g., if the value of the variable node 163 is a logical "0" value), the variable node update circuit 164 may flip the value of the variable node 163 if a number of unsatisfied check nodes 167 satisfies (e.g., is greater than or equal to) the first threshold 170. If the number of unsatisfied check nodes 167 fails to satisfy (e.g., is less than) the first threshold 170, the value of the variable node 163 is not flipped (e.g., remains the same). As another example, if the second threshold 171 is selected (e.g., if the value of the variable node 163 is a logical "1" value), the variable node update circuit 164 may flip the value of the variable node 163 if the number of unsatisfied check nodes 167 satisfies the second threshold 171. If the number of unsatisfied check nodes 167 fails to satisfy the second threshold 171, the value of the variable node 163 is not flipped.

During operation, the access device 150 may issue a data request 152 to the data storage device 102. The data request 152 may specify an address at the memory 104, such as a logical address of the one or more storage elements 106. The controller 120 may receive the data request 152 and may issue a read command to the memory 104. The read command may specify a physical address that corresponds to the logical address of the data request 152. In response to issuing the read command, the controller 120 may receive the representation of data 140 and the reliability information 142 from the memory 104. In some implementations, the representation of data 140 may include (or be decodable using) multiple separately decodable portions. For example, the representation of data 140 may include or correspond to multiple sub-codes.

Prior to receiving the data request 152, the data storage device 102 may receive another data request for a codeword that is in a memory location of the memory 104 that is relatively near to the location of the codeword requested by the data request 152. For example, the other nearby location may be located in the same die, block, or page of the memory 104 as the location addressed by the data request 152. During decoding of the other codeword, the error detection circuitry 160 may determine the bit counts 161. The bit counts 161 may include a total error (TE) count, a HE count, a URC count, one or more BERs, or a combination thereof, as non-limiting examples. The bit counts 161 may include counts of erroneous bits (and URC bits) having the first logical value and counts of erroneous bits (and URC bits) having the second logical value.

The bit-flipping ECC engine 168 may perform a bit-flipping ECC decode operation on the first representation of data 140 based on the bit counts 161. For example, the comparator 162 may select a threshold for use by the variable node update circuit 164, and the variable node update circuit 164 may adjust (e.g., flip) a value of one or more variable nodes (e.g., one or more bits of the representation of data 140) based on the selected threshold. A set of thresholds may be retrieved for each logical value based on the bit counts 161, and the threshold corresponding to a particular variable node (e.g., to a particular bit of the representation of data 140) may be selected from the fetched sets of thresholds.

In a particular implementation, the multiple sets of thresholds 112 stored at the memory 104 may be indexed by a BER or BER range (or by error counts, by bit counts, by error count ranges, or by bit count ranges). The multiple sets of thresholds 112 may be generated based on underlying models, such as Gaussian cell voltage distributions (CVDs) associated with a particular error rate (or range), a particular count (or range) of TEs, a particular count (or range) of HEs, a particular count (or range) of URC bits, a particular count (or range) of UREs, or a combination thereof. The particular error rate value (or range), or other count values (or ranges), may serve as indices for the multiple sets of thresholds 112.

In another particular implementation, the sets of thresholds are generated during operation of the data storage device 102 (e.g., "on-the-fly"). For example, the bit-flipping ECC engine 168 may determine a Gaussian CVD, or other model, based on the bit counts 161, and based on the Gaussian CVD (or other model), the bit-flipping ECC engine 168 may determine the multiple sets of thresholds 112 for use in performing the bit-flipping ECC decoding operations. After generation of the multiple sets of thresholds 112, the multiple sets of thresholds 112 may be stored, such as at a controller memory or at the memory 104.

Based on the bit counts 161 indicating a first BER associated with bits having the value logical "0", the bit-flipping ECC engine 168 may retrieve (or generate) the first set of thresholds 113 (e.g., the set of thresholds corresponding to the first BER). Additionally, based on the bit counts 161 indicating a second BER associated with bits having the value logical "1", the bit-flipping ECC engine 168 may retrieve (or generate) the second set of thresholds 114 (e.g., the set of thresholds corresponding to the second BER). To select a threshold corresponding to a particular variable node having the value of the variable node 163, the comparator 162 may compare the value of the variable node 163 to a logical "0" value. Based on the comparison being a match, the comparator 162 selects the first threshold 170 from the first set of thresholds 113. The first threshold 170 may be selected based further on a first error rate based at least in part on a first count of erroneous bits having the first logical value (e.g., a logical "0" value). Alternatively, if the comparison is not a match, the comparator 162 selects the second threshold 171 from the second set of thresholds 114. The second threshold 171 may be selected based further on a second error rate based at least in part on a second count of erroneous bits having the second logical value (e.g., a logical "1" value).

After selecting and retrieving the sets of thresholds from the memory 104 (or after generating the sets of thresholds), the particular threshold may be selected from the retrieved set of thresholds based on the clock cycle of a bit-flipping ECC decoder clock. To illustrate, the first set of thresholds 113 may include multiple thresholds, each threshold corresponding to one or more clock cycles. During each clock cycle, a subset (or all) of variable nodes may be processed and a particular threshold of the first set of thresholds 113 is selected as the first threshold 170. The second threshold 171 may be selected from the second set of thresholds 114 in a similar manner (e.g., if the value of the variable node 163 has a different value).

After a threshold is selected, the variable node update circuit 164 may adjust the value of the variable node 163 based on the selected threshold. For example, if the first threshold 170 is selected and the number of unsatisfied check nodes 167 satisfies the first threshold 170, the variable node update circuit 164 adjusts (e.g., flips) the value of the variable node 163. To illustrate, the variable node update circuit 164 may, if the value of the variable node 163 is a logical "0" value, set the value to a logical "1" value. Alternatively, the variable node update circuit 164 may, if the value of the variable node 163 is a logical "1" value, set the value to a logical "0" value. If the number of unsatisfied check nodes 167 fails to satisfy the first threshold 170, the variable node update circuit 164 may maintain the value of the variable node 163. Similarly, if the second threshold 171 is selected and the number of unsatisfied check nodes 167 satisfies the second threshold 171, the variable node update circuit 164 adjusts (e.g., flips) the value of the variable node 163. If the number of unsatisfied check nodes 167 fails to satisfy the second threshold 171, the variable node update circuit 164 may maintain the value of the variable node 163.

A similar process is performed for each variable node (e.g., each bit of the representation of data 140) to decode the representation of the data 140. In some implementations, the comparator 162 is configured to compare one or more bits of a bitwise syndrome vector to the selected thresholds to determine whether to flip the values of one or more variable nodes, and the comparator 162 provides an indication of whether to flip the values of one or more variable nodes to the variable node update circuit 164 to cause the variable node update circuit 164 to selectively flip the values of the one or more variable nodes.

The bit-flipping ECC engine 168 may generate final decoded data (e.g., output data 154) based on the decoded data generated during the decode operation (e.g., when the number of unsatisfied check nodes is not equal to zero for all variable nodes, possibly after multiple iterations of the bit-flipping decode operation). If decodable data is not generated after a specified number of iterations or clock cycles, the bit-flipping ECC engine 168 may provide the data to a more powerful decoder, such as a LDPC belief-propagator, for additional decoding. The data storage device 102 may provide the output data 154 to the access device 150 (e.g., responsive to the data request 152).

In a particular implementation, the sets of thresholds are selected based on logical values of the variable nodes and BERs (or error counts or bit counts). An example of setting thresholds based on logical values and BERs (or error counts or bit counts) is described herein with reference to FIG. 3. In another particular implementation, the sets of thresholds are selected based on logical values of the variable nodes, reliability information, and BERs (or error counts or bit counts). An example of setting thresholds based on logical values, reliability information, and BERs (or error counts or bit counts) is described herein with reference to FIG. 4.

In a particular implementation, the bit counts 161 are generated once per corresponding section of the memory 104 (e.g., die, block, page, etc.), and the thresholds are selected based on the bit counts 161. In an alternate implementation, the bit counts 161 are generated during processing of each codeword read from the memory 104. In this manner, outlying bit counts that may be determined based on one codeword read from a particular area of the memory 104 may be reduced or eliminated by reading other codewords from the same area of the memory 104.

Thus, the data storage device 102 of FIG. 1 may improve decoding of a representation of data using a bit-flipping ECC engine when measured errors do not match an underlying error model (e.g., a default or assumed error model), such as when errors are asymmetric. For example, an underlying error model may be symmetric, such as based on a Gaussian cell voltage distribution (CVD). However, during operation bits storing a particular logical value (e.g., a "0" or a "1" value) may have more errors than bits storing a different logical value (e.g., a "1" value or a "0" value), for example due to program disturb errors. To compensate for the asymmetric errors, thresholds that more closely reflect measured errors may be selected for use by the bit-flipping ECC engine 168, instead of selecting from a fixed set of thresholds that is based on an error model that diverges from the measured errors. Performing bit-flipping ECC decode operations using thresholds that reflect the measured channel errors may improve speed, improve decoding capability, and reduce power consumption of the decode operations, as compared to performing bit-flipping ECC decode operations using a fixed set of thresholds.

Figure 2:
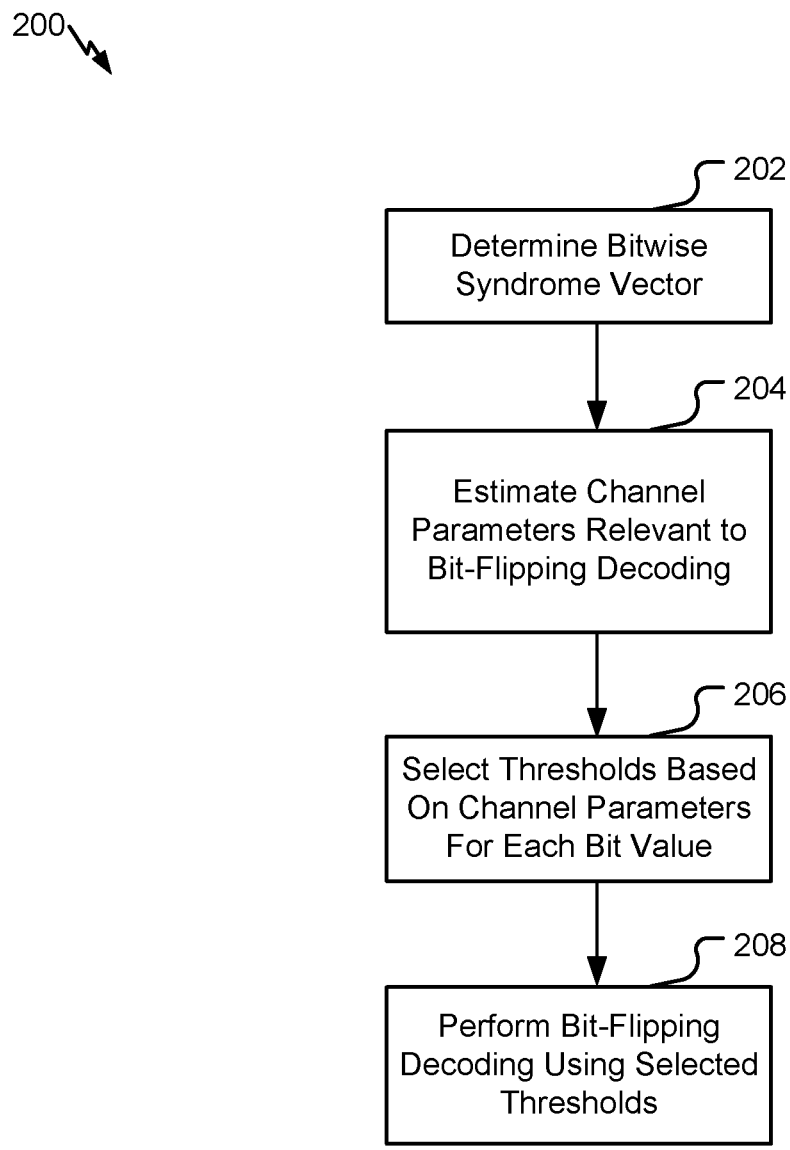
FIG. 2 is a flow diagram that illustrates an example of a method of adjusting a value of a variable node based on a selected threshold.

Referring to FIG. 2, a particular illustrative example of a method 200 of adjusting a value of a variable node based on a selected threshold is shown. The method 200 may be performed at a controller of a device, such as the controller 120 of the data storage device 102 of FIG. 1. In a particular implementation, the method 200 is performed at the bit-flipping ECC engine 168 of FIG. 1.

The method 200 includes determining a bitwise syndrome vector, at 202. For example, syndrome circuitry 166 of FIG. 1 may determine a bitwise syndrome vector based on the representation of data 140.

The method 200 includes estimating channel parameters relevant to bit-flipping decoding, at 204. For example, the error detection circuitry 160 of FIG. 1 may determine the bit counts 161. As illustrative non-limiting examples, the bit counts 161 may include a TE count, a HE count, a URC count, one or more BERs, or a combination thereof. In some implementations, the bit counts 161 include a first BER associated with bits having a logical "0" value and a second BER associated with bits having a logical "1" value. In some implementations, the bit counts 161 may include values based on reliability information, such as the reliability information 142 of FIG. 1.

The method 200 includes selecting thresholds based on channel parameters for each bit value, at 206. For example, the comparator 162 of FIG. 1 may select a threshold for a particular variable node from among a first set of thresholds or a second set of thresholds based on the logical value of the particular variable node. The first set of thresholds may be retrieved based on the first BER, and the second set of thresholds may be retrieved based on the second BER.

The method 200 further includes performing bit-flipping decoding using the selected thresholds, at 208. For example, the variable node update circuit 164 may flip the value of a particular variable node (e.g., a value of a particular bit of a representation of data) if the number of unsatisfied check nodes associated with the particular variable node satisfies the selected threshold.

The method 200 may improve decoding of a representation of data using a bit-flipping ECC engine when actual errors do not match an underlying error model (e.g., a default or assumed error model), such as when errors are asymmetric. For example, bits storing a particular logical value (e.g., a "0" or a "1" value) may have more errors than bits storing a different logical value (e.g., a "1" value or a "0" value), for example due to program disturb errors. To compensate for the asymmetric errors, thresholds that more closely reflect measured errors may be selected for use by the bit-flipping ECC engine, instead of selecting from a fixed set of thresholds that is based on an error model that diverges from the measured errors. Performing bit-flipping ECC decode operations using thresholds that reflect the measured channel errors may improve speed, improve decoding capability, and reduce power consumption of the decode operations.

Figure 3:
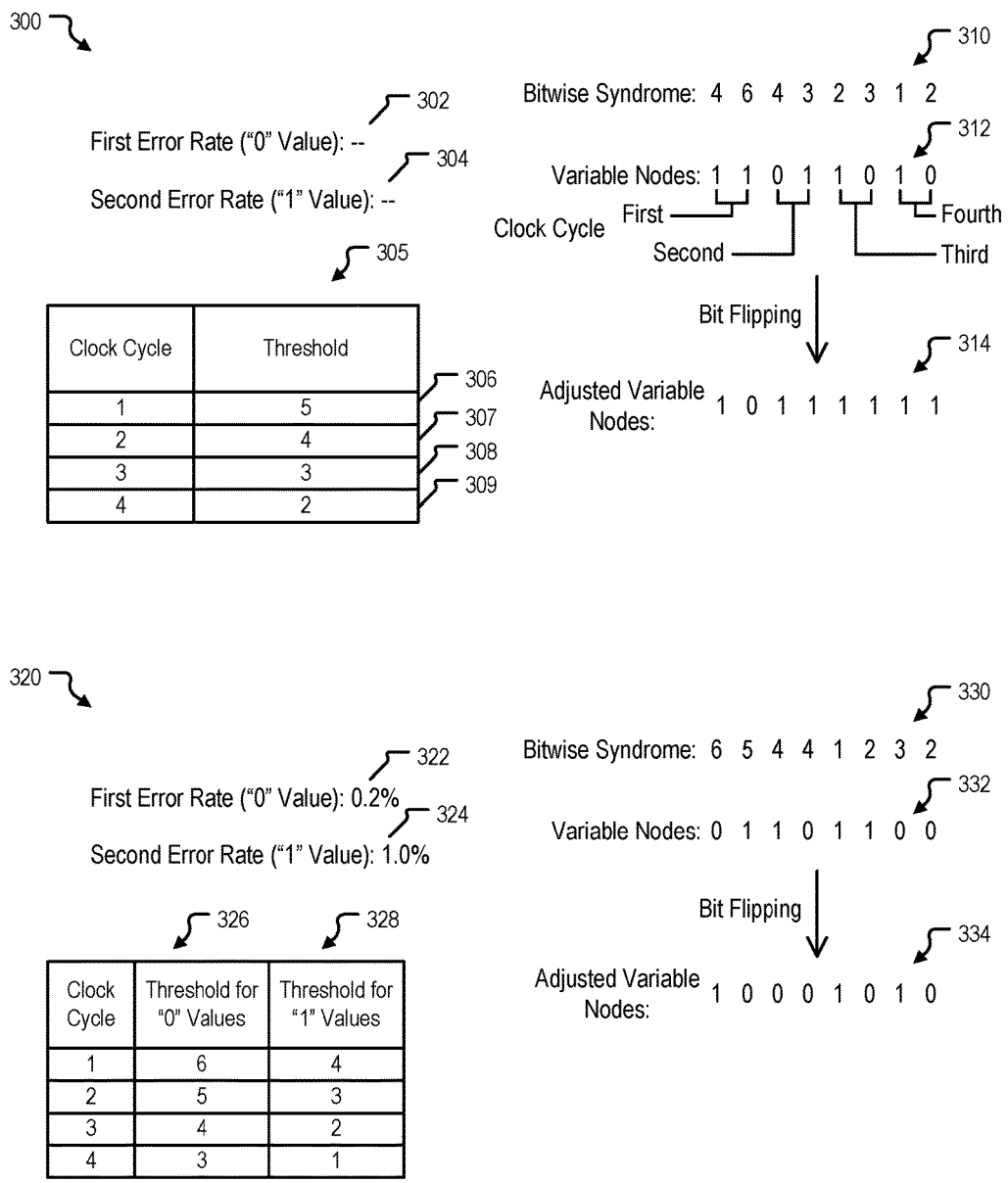
FIG. 3 illustrates illustrative examples of using a bit-flipping ECC engine to decode retrieved codewords.

FIG. 3 illustrates examples of using a bit-flipping ECC engine to decode retrieved codewords. FIG. 3 illustrates a first example 300 of performing bit-flipping decoding during an initial decode operation (e.g., during decoding of a first codeword from a particular die, block, or page of a memory, prior to any bit counts being generated). For example, as indicated by the null values for a first error rate 302 and a second error rate 304, no relevant codewords have been decoded such that no bit counts have been determined. Bit counts are determined during decoding described with reference to the first example 300 and are used during subsequent decoding operations.

During the initial decoding operation, an initial set of thresholds 305 is retrieved. The initial set of thresholds 305 includes multiple thresholds, each threshold corresponding to one or more clock cycles of a decoder clock. For example, the initial set of thresholds 305 includes a first threshold 306 corresponding to a first clock cycle, a second threshold 307 corresponding to a second clock cycle, a third threshold 308 corresponding to a third clock cycle, and a fourth threshold 309 corresponding to a fourth clock cycle. Each threshold indicates the minimum number of unsatisfied check nodes associated with a variable node that will cause the value of the variable node to be adjusted (e.g., flipped). Each threshold may be between 0 and $d_v$ (the variable node degree, or maximum number of check nodes that may be associated with a single variable node). For example, the first threshold 306 indicates that 5 or more unsatisfied check nodes being associated with a variable node will cause a value of the variable node to flip during decoding.

The first example 300 also includes a bitwise syndrome vector 310 and a plurality of variable nodes 312. Each element of the bitwise syndrome vector 310 indicates the number of unsatisfied check nodes associated with a corresponding variable node of the plurality of variable nodes 312. For example, because the first element of the bitwise syndrome vector 310 is 4, the first variable node of the plurality of variable nodes 312 is associated with 4 unsatisfied check nodes. In a particular implementation, the bitwise syndrome vector 310 is determined by the syndrome circuitry 166 of FIG. 1. Each of the variable nodes of the plurality of variable nodes 312 corresponds to a decode cycle during which the values of the variable nodes are selectively adjusted. To illustrate, the first variable node and the second variable node correspond to a first clock cycle (clock cycle 1), the third variable node and the fourth variable node correspond to a second clock cycle (clock cycle 2), the fifth variable node and the sixth variable node correspond to a third clock cycle (clock cycle 3), and the seventh variable node and the eighth variable node correspond to a fourth clock cycle (clock cycle 4). Although simplified examples are described herein, such as the plurality of variable nodes 312 having 8 nodes, with 2 nodes processed per clock cycle for clarity of explanation, in other implementations, hundreds, thousands, or more bits are included in a codeword and dozens or hundreds of nodes are processed per clock cycle.

A bit-flipping ECC decode operation may be performed on the plurality of variable nodes 312 (e.g., the bits of a representation of data, such as a codeword) during multiple clock cycles to generate adjusted variable nodes 314. During the bit-flipping ECC decode operation, the value of each variable node may be selectively adjusted (e.g., flipped) based on a comparison of the number of unsatisfied check nodes associated with the variable node and an initial threshold that corresponds to the current clock cycle of the decoder clock.

To illustrate, the first variable node is processed during the first clock cycle. The number of unsatisfied check nodes associated with the first variable node (4) is compared to the first threshold 306 (5) and it is determined that the number of unsatisfied check nodes does not satisfy the first threshold 306. Accordingly, the value of the first variable node is maintained at logical "1". However, because the number of unsatisfied check nodes associated with the second variable node (6) satisfies the first threshold 306 (5), the value of the second variable node is adjusted (e.g., flipped) from logical "1" to logical "0". Similarly, because the number of unsatisfied check nodes (4) associated with the third variable node satisfies the second threshold 307 (4), the value of the third variable node is adjusted from logical "0" to logical "1". However, because the number of unsatisfied check nodes associated with the fourth variable node (3) fails to satisfy the second threshold 307 (4), the value of the fourth variable node is maintained at logical "1". The fifth variable node and the sixth variable node are similarly processed using the third threshold 308, and the seventh variable node and the eighth variable node are similarly processed using the fourth threshold 309. In this manner, before error counts or bit counts are determined, a bit-flipping ECC operation may be performed based on a single initial set of thresholds. Although not illustrated, after each clock cycle, the bitwise syndrome vector 310 can be updated based on the flipping of one or more bits (during the clock cycle or during previous clock cycles).

FIG. 3 also illustrates a second example 320 of performing bit-flipping decoding during a later decode operation (e.g., during decoding of a second codeword after bit counts have been generated). For example, during the decoding described with reference to the first example 300, a first error rate 322 (e.g., a BER of bits having a logical "0" value) and a second error rate 324 (e.g., a BER of bits having a logical "1" value) may be determined. As a particular example, the first error rate 322 may be 0.2% and the second error rate 324 may be 1.0%. The particular error rates are not limiting, and in other examples the error rates may have other values. In a particular implementation, the first error rate 322 and the second error rate 324 may be determined by the error detection circuitry 160 of FIG. 1. Although described as bit error rates, in other implementations, error counts, such as hard error counts corresponding to each of the different logical values, may be used instead of error rates.

A first set of thresholds 326 may be retrieved based on the first error rate 322 and a second set of thresholds 328 may be retrieved based on the second error rate 324. For example, a non-volatile memory may store multiple sets of thresholds, each set of thresholds corresponding to a different error rate (or error count) or range, and sets of thresholds may be retrieved based on the measured error rates (or error counts). In other implementations, the thresholds may be generated or computed on the fly (e.g., instead of being stored at a non-volatile memory). As a non-limiting example, the first set of thresholds 326 may be associated with an error rate range of 0.0-0.49, and the second set of set of thresholds 328 may be associated with an error rate range of 1.0-1.49. Because the second set of thresholds 328 is retrieved based on a higher error rate, the second set of thresholds 328 may tend to include smaller thresholds than the first set of thresholds 326, such that fewer numbers of unsatisfied check nodes cause adjustment (e.g., flipping) of a particular bit. Similar to the initial set of thresholds 305, each of the thresholds of the first set of thresholds 326 and the second set of thresholds 328 correspond to a particular clock cycle of the decoder clock.

The second example 320 also includes a bitwise syndrome vector 330 and a plurality of variable nodes 332. Each element of the bitwise syndrome vector 330 indicates the number of unsatisfied check nodes associated with a corresponding variable node of the plurality of variable nodes 332. In a particular implementation, the bitwise syndrome vector 330 is determined by the syndrome circuitry 166 of FIG. 1. Each variable node of the plurality of variable nodes 332 corresponds to a decode cycle during which the values of the variable nodes are selectively adjusted, as described with reference to the first example 300.

A bit-flipping ECC decode operation may be performed on the plurality of variable nodes 332 (e.g., the bits of a representation of data, such as a codeword) during multiple clock cycles to generate adjusted variable nodes 334. During the bit-flipping ECC decode operation, the value of each variable node may be selectively adjusted (e.g., flipped) based on a comparison of the number of unsatisfied check nodes associated with the variable node and a threshold that corresponds to the current clock cycle of the decoder clock and that is selected based on the logical value of the variable node.

To illustrate, the first variable node is processed during the first clock cycle. Because the first variable node has a logical "0" value, a first threshold from the first set of thresholds 326 is selected. The number of unsatisfied check nodes associated with the first variable node (6) is compared to the first threshold (6) of the first set of thresholds 326, and it is determined that the number of unsatisfied check nodes satisfies the first threshold. Accordingly, the value of the first variable node is adjusted from logical "0" to logical "1". Additionally, because the value of the second variable node is logical "1", a second threshold from the second set of thresholds 328 is selected. It is determined that the number of unsatisfied check nodes associated with the second variable node (5) satisfies the second threshold (4) of the second set of thresholds 328. Accordingly, the value of the second variable node is adjusted from logical "1" to logical "0".

In this manner, a set of thresholds is selected based on the logical value of the variable node, and the particular threshold of the set of thresholds is selected based on the current clock cycle of a decoder clock. For example, the comparator 162 of FIG. 1 may be configured to select the first set of thresholds 113 or the second set of thresholds 114 based on the value of the variable node and to retrieve the selected threshold from the selected set of thresholds. The comparator 162 may be further configured to perform a look-up operation to retrieve the selected threshold from the selected set of thresholds based on a count of cycles of a decoder clock.

As additional illustration, because the value of the third variable node is logical "1", a third threshold (corresponding to the second clock cycle) is selected from the second set of thresholds 328. It is determined that the number of unsatisfied check nodes (4) associated with the third variable node satisfies the third threshold (3). Accordingly, the value of the third variable node is adjusted from logical "1" to logical "0". Additionally, because the value of the fourth variable node is logical "0", a fourth threshold (corresponding to the second clock cycle) is selected from the first set of thresholds 326. It is determined that the number of unsatisfied check nodes associated with the fourth variable node (4) fails to satisfy the fourth threshold (5). Accordingly, the value of the fourth variable node is maintained at logical "0". The fifth variable node and the sixth variable node are similarly processed using thresholds that correspond to the third clock cycle and are selected based on the value of the respective variable node, and the seventh variable node and the eighth variable node are similarly processed using thresholds that correspond to the fourth clock cycle and are selected based on the value of the respective variable node.

In this manner, the thresholds are selected such that the measured errors (e.g., the first error rate 322 and the second error rate 324) are represented in the selected thresholds (and sets of thresholds). Using the selected thresholds to perform bit-flipping ECC decode operations may improve error correcting capability, decrease latency, and decrease power consumption of the decode operations.

Figure 4:
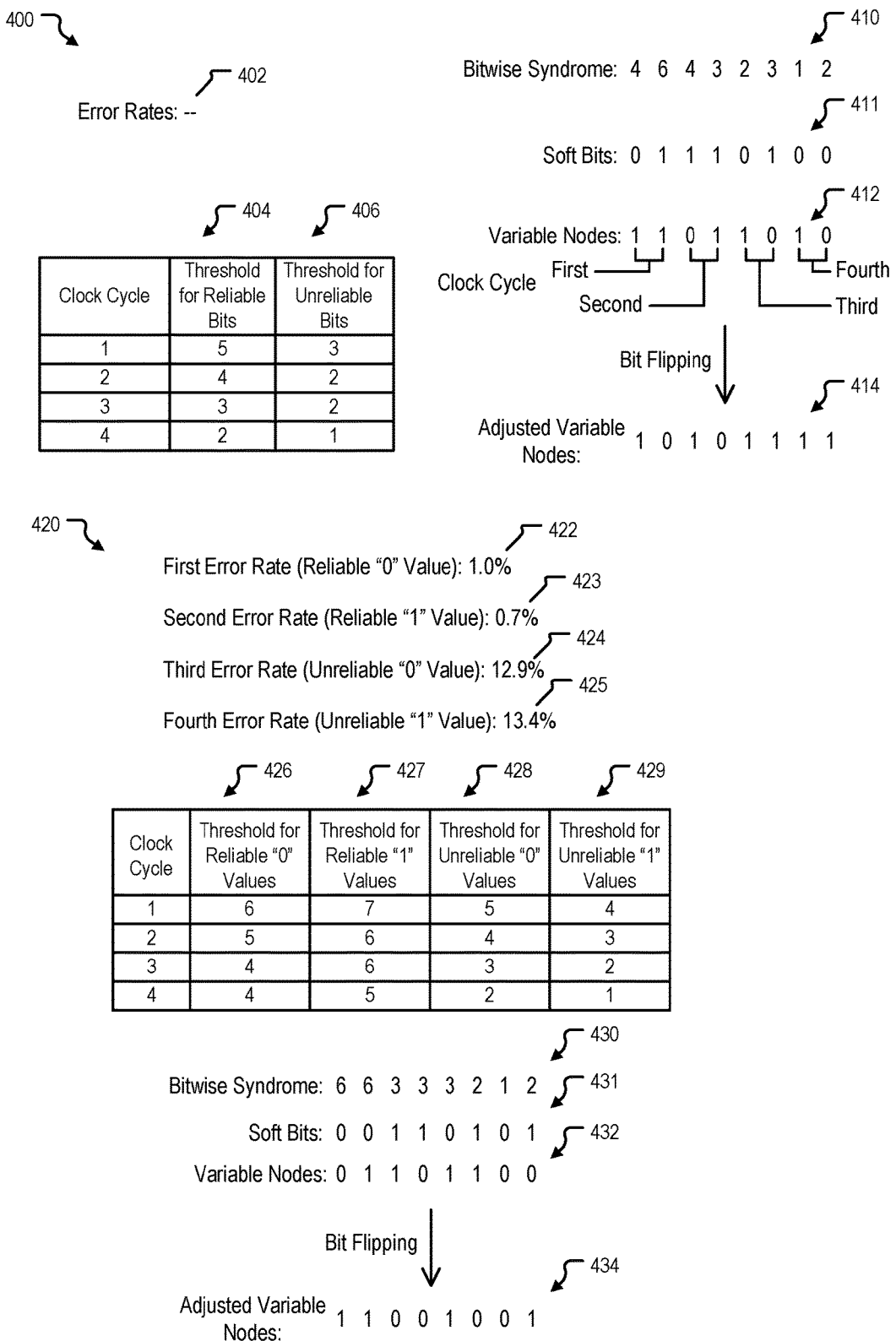
FIG. 4 illustrates illustrative examples of using a bit-flipping ECC engine to decode retrieved codewords.

FIG. 4 illustrates examples of using a bit-flipping ECC engine to decode retrieved codewords. FIG. 4 illustrates a first example 400 of performing bit-flipping decoding during an initial decode operation (e.g., during decoding of a first codeword from a particular die, block, or page of a memory, prior to any bit counts being generated). For example, as indicated by the null values for error rates 402, no relevant codewords have been decoded such that no bit counts have been determined. Bit counts are determined during decoding described with reference to the first example 400 and are used during subsequent decoding operations.

During the initial decoding operation, a first initial set of thresholds 404 and a second initial set of thresholds 406 are retrieved. The first initial set of thresholds 404 and the second initial set of thresholds 406 include multiple thresholds, each threshold corresponding to one or more clock cycles of a decoder clock. Each threshold indicates the minimum number of unsatisfied check nodes associated with a variable node that will cause the value of the variable node to be adjusted (e.g., flipped). Each threshold may be between 0 and $d_v$ (the variable node degree, or maximum number of check nodes that may be associated with a single variable node). The second set of thresholds 406 includes smaller thresholds than the first set of thresholds 404 because the second set of thresholds 406 is to be used for variable nodes that are indicated as unreliable by corresponding reliability information.

The first example 400 also includes a bitwise syndrome vector 410, soft bits 411, and a plurality of variable nodes 412. Each element of the bitwise syndrome vector 410 indicates the number of unsatisfied check nodes associated with a corresponding variable node of the plurality of variable nodes 412. In a particular implementation, the bitwise syndrome vector 410 is determined by the syndrome circuitry 166 of FIG. 1. Each of the soft bits 411 indicate reliability of a corresponding variable node of the plurality of variable nodes 412. For example, a variable node corresponding to a soft bit having a "0" value is indicated as reliable, and a variable node corresponding to a soft bit having a "1" value is indicated as unreliable. Although soft bits are described, in other implementations, other forms of reliability information may be used. Each of the variable nodes of the plurality of variable nodes 412 correspond to a decode cycle during which the values of the variable nodes are selectively adjusted. To illustrate, the first variable node and the second variable node correspond to a first clock cycle (clock cycle 1), the third variable node and the fourth variable node correspond to a second clock cycle (clock cycle 2), the fifth variable node and the sixth variable node correspond to a third clock cycle (clock cycle 3), and the seventh variable node and the eighth variable node correspond to a fourth clock cycle (clock cycle 4).

A bit-flipping ECC decode operation may be performed on the plurality of variable nodes 412 (e.g., the bits of a representation of data, such as a codeword) during multiple clock cycles to generate adjusted variable nodes 414. During the bit-flipping ECC decode operation, the value of each variable node may be selectively adjusted (e.g., flipped) based on a comparison of the number of unsatisfied check nodes associated with the variable node and a selected threshold that corresponds to the current clock cycle of the decoder clock and to the reliability indicated by a corresponding soft bit.

To illustrate, the first variable node is processed during the first clock cycle. Because the corresponding soft bit is "0", a first threshold from the first set of thresholds 404 is selected. The number of unsatisfied check nodes associated with the first variable node (4) is compared to the first threshold (5) and it is determined that the number of unsatisfied check nodes does not satisfy the first threshold.

Accordingly, the value of the first variable node is maintained at logical "1". Additionally, because the soft bit corresponding to the second variable node is "1", a second threshold is selected from the second set of thresholds 406. It is determined that the number of unsatisfied check nodes associated with the second variable node (6) satisfies the second threshold (3). Accordingly, the value of the second variable node is adjusted (e.g., flipped) from logical "1" to logical "0".

Similarly, because the soft bit corresponding to the third variable node is "1", a third threshold is selected from the second set of thresholds 406. It is determined that the number of unsatisfied check nodes (4) associated with the third variable node satisfies the third threshold (2). Accordingly, the value of the third variable node is adjusted from logical "0" to logical "1". Additionally, because the soft bit corresponding to the fourth variable node is also "1", the third threshold is selected for use with the fourth variable node. It is determined that the number of unsatisfied check nodes associated with the fourth variable node (3) satisfies the third threshold (2). Accordingly, the value of the fourth variable is adjusted from logical "1" to logical "0". The fifth variable node and the sixth variable node are similarly processed using thresholds that correspond to the third clock cycle, and the seventh variable node and the eighth variable node are similarly processed using thresholds that correspond to the fourth clock cycle. In this manner, before error counts or bit counts are determined, a bit-flipping ECC operation may be performed based on one initial set of thresholds for each reliability value.

FIG. 4 also illustrates a second example 420 of performing bit-flipping decoding during a later decode operation (e.g., during decoding of a second codeword after bit counts have been generated). For example, during the decoding described with reference to the first example 400, a first error rate 422 (e.g., a BER of bits having a logical "0" value and indicated as reliable), a second error rate 423 (e.g., a BER of bits having a logical "1" value and indicated as reliable), a third error rate 424 (e.g., a BER of bits having a logical "0" value and indicated as unreliable), and a fourth error rate 425 (e.g., a BER of bits having a logical "1" value and indicated as unreliable) may be determined. As a particular example, the first error rate 422 may be 1.0%, the second error rate 423 may be 0.7%, the third error rate 424 may be 2.9%, and the fourth error rate 425 may be 3.4%. The particular error rates are not limiting, and in other examples the error rates 422-425 may have other values. In a particular implementation, the error rates 422-425 may be determined by the error detection circuitry 160 of FIG. 1. Although described as bit error rates, in other implementations, error counts, such as hard error counts corresponding to each of the different logical values, may be used instead of error rates.

A first set of thresholds 426 may be retrieved based on the first error rate 422, a second set of thresholds 427 may be retrieved based on the second error rate 423, a third set of thresholds 428 may be retrieved based on the third error rate 424, and a fourth set of thresholds 429 may be retrieved based on the fourth error rate 425. For example, a non-volatile memory may store multiple sets of thresholds, each set of thresholds corresponding to a different error rate (or error count) or range, and sets of thresholds may be retrieved based on the measured error rates (or error counts). In other implementations, the thresholds may be generated and computed on the fly (e.g., instead of being stored at a non-volatile memory). As a non-limiting example, the first set of thresholds 426 may be associated with an error rate range of 1.0-1.49, the second set of thresholds 427 may be associated with an error rate range of 0.5-0.99, the third set of thresholds 428 may be associated with an error rate range of 12.5-12.99, and the fourth set of thresholds may be associated with an error rate range of 13.0-13.49. Because the first set of thresholds 426 is retrieved based on a higher error rate than the second set of thresholds 427, the first set of thresholds 426 may tend to include smaller thresholds than the second set of thresholds 427, such that fewer numbers of unsatisfied check nodes cause adjustment (e.g., flipping) of a particular bit. Similarly, the fourth set of thresholds 429 includes smaller thresholds than the third set of thresholds 428. Similar to the sets of thresholds 404 and 406, each of the thresholds of the sets of thresholds 426-429 correspond to a particular clock cycle of the decoder clock.

The second example 420 also includes a bitwise syndrome vector 430, soft bits 431, and a plurality of variable nodes 432. Each element of the bitwise syndrome vector 430 indicates the number of unsatisfied check nodes associated with a corresponding variable node of the plurality of variable nodes 432. In a particular implementation, the bitwise syndrome vector 430 is determined by the syndrome circuitry 166 of FIG. 1. Each of the soft bits 431 indicate reliability of a corresponding variable node of the plurality of variable nodes 432. In a particular implementation, the soft bits 431 correspond to the reliability information 142 of FIG. 1. Each variable node of the plurality of variable nodes 432 corresponds to a decode cycle during which the values of the variable nodes are selectively adjusted, as described with reference to the first example 400.

A bit-flipping ECC decode operation may be performed on the plurality of variable nodes 432 (e.g., the bits of a representation of data, such as a codeword) during multiple clock cycles to generate adjusted variable nodes 434. During the bit-flipping ECC decode operation, the value of each variable node may be selectively adjusted (e.g., flipped) based on a comparison of the number of unsatisfied check nodes associated with the variable node and a threshold that corresponds to the current clock cycle of the bit-flipping ECC decoder clock and that is selected based on the logical value of the variable node and the value of the corresponding soft bit.

To illustrate, the first variable node is processed during the first clock cycle. Because the first variable node has a logical "0" value and the soft bit corresponding to the first variable node is "0" (e.g., indicating the value of the first variable node is reliable), a first threshold from the first set of thresholds 426 is selected. The number of unsatisfied check nodes associated with the first variable node (6) is compared to the first threshold (6) of the first set of thresholds 426, and it is determined that the number of unsatisfied check nodes satisfies the first threshold. Accordingly, the value of the first variable node is adjusted from logical "0" to logical "1". Additionally, because the value of the second variable node is logical "1" and the soft bit corresponding to the second variable node is "0", a second threshold from the second set of thresholds 427 is selected. It is determined that the number of unsatisfied check nodes associated with the second variable node (6) fails to satisfy the second threshold (7) of the second set of thresholds 427. Accordingly, the value of the second variable node is maintained at logical "1".

In this manner, a set of thresholds is selected based on the logical value of the variable node and the corresponding reliability information, and the particular threshold of the set of thresholds is selected based on the current clock cycle of a decoder clock. For example, the comparator 162 of FIG. 1 may be configured to select the first set of thresholds 426, the second set of thresholds 427, the third set of thresholds 428, or the fourth set of thresholds 429 based on the value of the variable node and further based on a reliability indicator (e.g., the reliability information 142 of FIG. 1) associated with the value of the variable node. The comparator 162 can be further configured to retrieve the selected threshold from the selected set of thresholds. The value of the variable node may correspond to a hard bit value, and the reliability indicator may correspond to a soft bit value (e.g., the soft bits 431).

As additional illustration, because the value of the third variable node is logical "1" and the corresponding soft bit is "1", a third threshold (corresponding to the second clock cycle) is selected from the fourth set of thresholds 429. It is determined that the number of unsatisfied check nodes (3) associated with the third variable node satisfies the third threshold (3). Accordingly, the value of the third variable node is adjusted from logical "1" to logical "0". Additionally, because the value of the fourth variable node is logical "0" and the corresponding soft bit is "1", a fourth threshold (corresponding to the second clock cycle) is selected from the third set of thresholds 428. It is determined that the number of unsatisfied check nodes associated with the fourth variable node (3) fails to satisfy the fourth threshold (4). Accordingly, the value of the fourth variable node is maintained at logical "0". The fifth variable node and the sixth variable node are similarly processed using thresholds that correspond to the third clock cycle and are selected based on the value of the respective variable node and the respective soft bit, and the seventh variable node and the eighth variable node are similarly processed using thresholds that correspond to the fourth clock cycle and are selected based on the value of the respective variable node and the respective soft bit.

In this manner, the thresholds are selected such that the measured errors (e.g., the error rates 422-425) are represented in the selected thresholds (and sets of thresholds). Using the selected thresholds to perform bit-flipping ECC decode operations may improve error correcting capability, decrease latency, and decrease power consumption of the decode operations.

Figure 5:
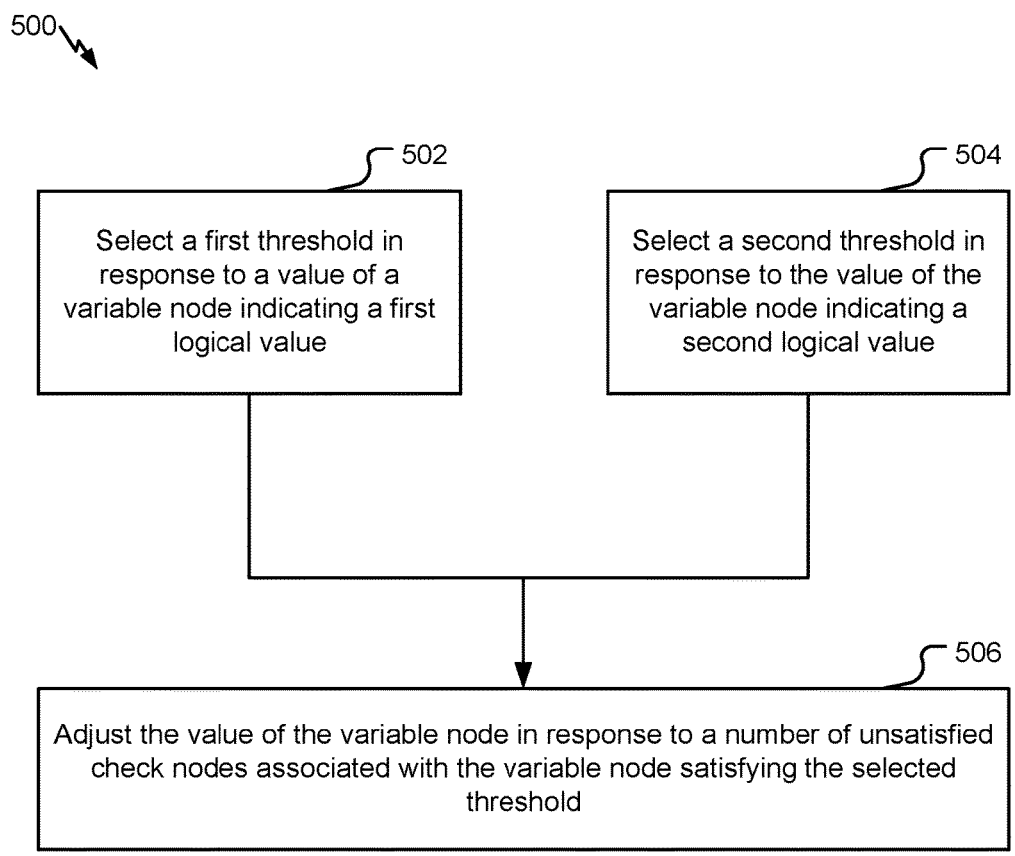
FIG. 5 is a flow diagram that illustrates an example of a method of adjusting a value of a variable node based on a selected threshold.

Referring to FIG. 5, a particular illustrative example of a method 500 of adjusting a value of a variable node based on a selected threshold is shown. The method 500 may be performed at a controller of a device, such as the controller 120 of the data storage device 102 of FIG. 1. In a particular implementation, the method 500 is performed at a bit-flipping ECC engine, such as the bit-flipping ECC engine 168 of FIG. 1.

The method 500 may include selecting a first threshold in response to a value of a variable node indicating a first logical value, at 502. For example, the first threshold may include or correspond to the first threshold 170, and the value of the variable node may include or correspond to the value of the variable node 163 of FIG. 1.

Alternatively, the method 500 may include selecting a second threshold in response to the value of the variable node indicating a second logical value, at 504. For example, the second threshold may include or correspond to the second threshold 171 of FIG. 1.

The method 500 further includes adjusting the value of the variable node in response to a number of unsatisfied check nodes associated with the variable node satisfying the selected threshold, at 506. For example, the number of unsatisfied check nodes may include or correspond to the number of unsatisfied check nodes 167 determined by the syndrome circuitry 166 of FIG. 1.

In a particular implementation, the method 500 includes determining one or more bit counts based on one or more codewords read from a memory, the one or more bit counts including a first count of erroneous bits having the first logical value and a second count of erroneous bits having the second logical value. For example, the one or more bit counts may include or correspond to the bit counts 161 determined by the error detection circuitry 160 of FIG. 1. The method 500 also includes selecting a first set of thresholds or a second set of thresholds based on the value of the variable node. For example, the first set of thresholds may include or correspond to the first set of thresholds 113 and the second set of thresholds may include or correspond to the second set of thresholds 114 of FIG. 1. The first set of thresholds is associated with the first logical value and the first count. The second set of thresholds is associated with the second logical value and the second count. In this implementation, the method 500 further includes retrieving the selected threshold from the selected set of thresholds. For example, the variable node update circuit 164 may retrieve the first threshold 170 from the first set of thresholds 113. The method 500 may further include performing a look-up operation to retrieve the selected threshold from the selected set of thresholds based on a count of decoding clock cycles of the bit-flipping decoder clock. For example, the first threshold 170 may be retrieved from the first set of thresholds 113 based on a count of decoding clock cycles at the bit-flipping ECC engine 168 of FIG. 1.

In another particular implementation, the method 500 includes selecting a first set of thresholds, a second set of thresholds, a third set of thresholds, or a fourth set of thresholds based on the value of the variable node and based on a reliability indicator associated with the value of the variable node. For example, the first set of thresholds 426, the second set of thresholds 427, the third set of thresholds 428, or the fourth set of thresholds 429 may be selected based on the values of the variable nodes 432 and the soft bits 431. The first set of thresholds and the third set of thresholds are associated with the first logical value, and the second set of thresholds and the fourth set of thresholds are associated with the second logical value. In this implementation, the method 500 further includes retrieving the selected threshold from the selected set of thresholds. In at least one implementation, the first set of thresholds and the second set of thresholds are further associated with a first reliability value and the third set of thresholds and the fourth set of thresholds are further associated with a second reliability value. For example, the value of the variable node may correspond to a hard bit, and the reliability indicator may correspond to a soft bit.

The first set of thresholds may be selected based further on a first bit error rate associated with bits having the first logical value and the first reliability value, the second set of thresholds is selected based further on a second bit error rate associated with bits having the second logical value and the first reliability value, the third set of thresholds is selected based further on a third bit error rate associated with bits having the first logical value and the second reliability value, and the fourth set of thresholds is selected based further on a fourth bit error rate associated with bits having the second logical value and the second reliability value. For example, the first set of thresholds 426 may be selected based at least in part on the first error rate 422 (e.g., the error rate associated with a logical "0" value that is reliable), the second set of thresholds 427 may be selected based at least in part on the second error rate 423 (e.g., the error rate associated with a logical "1" value that is reliable), the third set of thresholds 428 may be selected based at least in part on the third error rate 424 (e.g., the error rate associated with a logical "0" value that is unreliable), and the fourth set of thresholds 429 may be selected based at least in part on the fourth error rate 425 (e.g., the error rate associated with a logical "1" value that is unreliable).

The method 500 may improve decoding of a representation of data using a bit-flipping ECC decoder when actual errors do not match an underlying error model (e.g., a default or assumed error model), such as when errors are asymmetric based on logical value (or based on logical value and reliability value). To illustrate, thresholds that more closely reflect the measured errors may be selected for use by the bit-flipping ECC engine. Performing decode operations using thresholds that reflect the measured channel errors may improve speed, improve decoding capability, and reduce power consumption of the decode operations.

The method 200 of FIG. 2, the method 500 of FIG. 5, or a combination thereof, may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 200 of FIG. 2, the method 500 of FIG. 5, or a combination thereof, can be initiated or controlled by one or more processors, such as one or more processors included in or coupled to a controller or a memory of the data storage device 102 and/or the access device 150 of FIG. 1. As an example, the method 200 of FIG. 2, the method 500 of FIG. 5, or a combination thereof, individually or in combination, may be performed by the controller 120 of FIG. 1 or a portion thereof, such as the bit-flipping ECC engine 168. Additionally, a portion of the method 200 of FIG. 2 or a portion of the method 500 of FIG. 5 may be combined with other operations described herein. Additionally, one or more operations described with reference to FIGS. 2 and 5 may be optional, may be performed at least partially concurrently, and/or may be performed in a different order than shown or described.

In an illustrative example, a processor may be programmed to select one or more thresholds based on bit counts associated with a decoded representation of data (or a portion thereof). For example, the processor may execute instructions to select a first threshold in response to a value of a variable node indicating a first logical value or a second threshold in response to the value of the variable node indicating a second logical value. The processor may further execute instructions to adjust the value of the variable node in response to a number of unsatisfied check nodes associated with the variable node satisfying the selected threshold.

Although various components of the data storage device 102 and/or the access device 150 of FIG. 1 are depicted herein as block components and described in general terms, such components may include one or more microprocessors, state machines, or other circuits configured to enable the various components to perform operations described herein. For example, the bit-flipping ECC engine 168, the comparator 162, the variable node update circuit 164, the syndrome circuitry 166, the error detection circuitry 160, or a combination thereof, may represent physical components, such as hardware controllers, state machines, logic circuits, or other structures, to enable the controller 120 to encode and decode data.

It should be appreciated that one or more aspects of the various components may be implemented using a microprocessor or microcontroller programmed to perform operations described herein, such as one or more operations of the method 200 of FIG. 2 or the method 500 of FIG. 5. In a particular implementation, each of the controller 120, the memory 104, and/or the access device 150 of FIG. 1 includes a processor executing instructions that are stored at a memory, such as a non-volatile memory of the data storage device 102 or the access device 150 of FIG. 1. Alternatively or additionally, executable instructions that are executed by the processor may be stored at a separate memory location that is not part of the non-volatile memory, such as at a read-only memory (ROM) of the data storage device 102 or the access device 150 of FIG. 1.

In a particular implementation, an apparatus includes means for selecting a first threshold in response to a value of a variable node indicating a first logical value and for selecting a second threshold in response to the value of the variable node indicating a second logical value. For example, the means for selecting may include the comparator 162 of FIG. 1, one or more other devices, circuits, or instructions to select a first threshold in response to a value of a variable node indicating a first logical value and for selecting a second threshold in response to the value of the variable node indicating a second logical value, or a combination thereof The apparatus includes means for reading a representation of data from the means for storing. For example, the means for reading may include the memory interface 122 of FIG. 1, the controller 120 of FIG. 1, one or more other devices, circuits, modules, or instructions to read a representation of data, or a combination thereof The apparatus further includes means for adjusting the value of the variable node in response to a number of unsatisfied check nodes associated with the variable node satisfying the selected threshold. For example, the means for adjusting may include the variable node update circuit 164 of FIG. 1, one or more other devices, circuits, or instructions to adjust the value of the variable node in response to a number of unsatisfied check nodes associated with the variable node satisfying the selected threshold, or a combination thereof In a particular implementation, the apparatus further includes means for storing a representation of a codeword and means for performing a bit-flipping decoding operation on the representation of the codeword read from the means for storing. For example, the means for storing may include the memory 104 of FIG. 1, one or more other devices, circuits, or instructions to store a representation of a codeword, or a combination thereof. As another example, the means for performing may include the bit-flipping ECC engine 168 of FIG. 1, one or more other devices, circuits, or instructions to perform a bit-flipping decoding operation on the representation of the codeword read from the means for storing. The means for performing may include the means for selecting and the means for adjusting.

In at least one implementation, the apparatus further includes means for determining a number of unsatisfied check nodes associated with each variable node of a plurality of variable nodes. For example, the means for determining may include the syndrome circuitry 166 of FIG. 1, one or more other devices, circuits, or instructions to determine a number of unsatisfied check nodes associated with each variable node of a plurality of variable nodes, or a combination thereof. The plurality of variable nodes corresponds to bits of the representation of the codeword.

In another particular implementation, the means for selecting is further configured to select a first set of thresholds or a second set of thresholds based on the value of the variable node. The first set of thresholds is associated with the first logical value and the second set of thresholds is associated with the second logical value. The means for selecting is further configured to retrieve the selected threshold from the selected set of thresholds.

With reference to FIG. 1, in some implementations, the data storage device 102 may be embedded within the access device 150, such as in accordance with a Joint Electron Devices Engineering Council (JEDEC) Solid State Technology Association Universal Flash Storage (UFS) configuration. Alternatively, the data storage device 102 may be removable from the access device 150 (i.e., "removably" coupled to the access device 150). As an example, the data storage device 102 may be removably coupled to the access device 150 in accordance with a removable universal serial bus (USB) configuration. In some implementations, the data storage device 102 may include or correspond to a solid state drive (SSD) which may be included in, or distinct from (and accessible to), the access device 150. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the access device 150 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be configured to be coupled to the access device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Virginia), or a CompactFlash® (CF) card (trademark of SanDisk Corporation, Milpitas, Calif.). Alternatively, the data storage device 102 may be removable from the access device 150 (e.g., "removably" coupled to the access device 150). As an example, the data storage device 102 may be removably coupled to the access device 150 in accordance with a removable universal serial bus (USB) configuration.

The data storage device 102 may operate in compliance with an industry specification. For example, the data storage device 102 may include a SSD and may be configured to communicate with the access device 150 using a small computer system interface (SCSI)-type protocol, such as a serial attached SCSI (SAS) protocol. As other examples, the data storage device 102 may be configured to communicate with the access device 150 using a NVM Express (NVMe) protocol or a serial advanced technology attachment (SATA) protocol. In other examples, the data storage device 102 may operate in compliance with a JEDEC eMMC specification, a JEDEC universal flash storage (UFS) specification, one or more other specifications, or a combination thereof, and may be configured to communicate using one or more protocols, such as an eMMC protocol, a UFS protocol, a USB protocol, and/or another protocol, as non-limiting examples.

In some implementations, the data storage device 102 and the access device 150 may be configured to communicate using one or more protocols, such as a SAS protocol, a SATA protocol, an NVMe protocol, an eMMC protocol, a UFS protocol, a USB protocol, and/or another protocol, as illustrative, non-limiting examples. The one or more protocols may include a standardized protocol and/or a non-standardized protocol, such as a proprietary protocol. As other examples, the access device 150 may operate in compliance with a JEDEC industry specification, such as a UFS Access Controller Interface specification. In some implementations, the data storage device 102 and the access device 150 may be configured to communicate using dual channel communication (e.g., both devices may issue and receive commands from the other device).

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), phase change memory (PCM), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
 a comparator configured to select a first threshold in response to a value of a variable node indicating a first logical value and to select a second threshold in response to the value of the variable node indicating a second logical value; and
 a variable node update circuit configured to adjust the value of the variable node in response to a number of unsatisfied check nodes associated with the variable node satisfying the selected threshold.

2. The device of claim 1. further comprising:
 a memory; and
 a bit-flipping error correction code (ECC) decoder configured to perform a bitflipping decoding operation on a representation of a codeword read from the memory, the bit-flipping ECC decoder comprising:
 the comparator; and
 the variable node update circuit.

3. The device of claim 2, further comprising syndrome circuitry configured to determine, for each particular variable node of a plurality of variable nodes, a number of unsatisfied check nodes associated with the particular variable node.

4. The device of claim 1, further comprising error detection circuitry configured to determine, based on one or more codewords read from a memory, a first count of erroneous bits having the first logical value and a second count of erroneous bits having the second logical value, wherein the comparator is further configured to select the first threshold based further on a first error rate based at least in part on the first count and to select the second threshold based further on a second error rate based at least in part on the second count.

5. The device of claim 4, wherein the error detection circuitry is further configured to determine, based on the one or more codewords, a third count of unreliable correct bits having the first logical value and a fourth count of unreliable correct bits having the second logical value, wherein the comparator is further configured to select the first threshold based further on the third count and to select the second threshold based further on the fourth count.

6. The device of claim 1, further comprising:
a first set of thresholds associated with the first logical value; and
a second set of thresholds associated with the second logical value.

7. The device of claim 6, wherein the comparator is further configured to:
select the first set of thresholds or the second set of thresholds based on the value of the variable node; and
retrieve the selected threshold from the selected set of thresholds.

8. The device of claim 7, wherein the comparator is further configured to perform a look-up operation to retrieve the selected threshold from the selected set of thresholds based on a count of cycles of a decoder clock.

9. The device of claim 6, further comprising:
a third set of thresholds associated with the first logical value; and
a fourth set of thresholds associated with the second logical value.

10. The device of claim 9, wherein the comparator is further configured to:
select the first set of thresholds, the second set of thresholds, the third set of thresholds, or the fourth set of thresholds based on the value of the variable node-and further based on a reliability indicator associated with the value; and
retrieve the selected threshold from the selected set of thresholds.

11. The device of claim 10, wherein:
the value of the variable node-corresponds to a hard bit value; and
the reliability indicator corresponds to a soft bit value.

12. A method comprising:
selecting, at a bit-flipping decoder:
a first threshold in response to a value of a variable node indicating a first logical value; or
a second threshold in response to the value of the variable node indicating a second logical value; and
adjusting the value of the variable node in response to a number of unsatisfied check nodes associated with the variable node satisfying the selected threshold.

13. The method of claim 12, further comprising:
determining one or more bit counts based on one or more codewords read from a memory, the one or more bit counts including a first count of erroneous bits having the first logical value and a second count of erroneous bits having the second logical value;
selecting a first set of thresholds or a second set of thresholds based on the value of the variable node, the first set of thresholds associated with the first logical value and the first count, and the second set of thresholds associated with the second logical value and the second count; and
retrieving the selected threshold from the selected set of thresholds.

14. The method of claim 13, further comprising performing a look-up operation to retrieve the selected threshold from the selected set of thresholds based on a count of decoding clock cycles of the bit-flipping decoder.

15. The method of claim 12, further comprising:
selecting a first set of thresholds, a second set of thresholds, a third set of thresholds, or a fourth set of thresholds based on the value of the variable node and based on a reliability indicator associated with the value of the variable node,
wherein:
the first set of thresholds and the third set of thresholds are associated with the first logical value, and
the second set of thresholds and the fourth set of thresholds are associated with the second logical value; and
retrieving the selected threshold from the selected set of thresholds.

16. The method of claim 15, wherein:
the first set of thresholds and the second set of thresholds are further associated with a first reliability value; and
the third set of thresholds and the fourth set of thresholds are further associated with a second reliability value.

17. The method of claim 16, wherein:
the first set of thresholds is selected based further on a first bit error rate associated with bits having the first logical value and the first reliability value;
the second set of thresholds is selected based further on a second bit error rate associated with bits having the second logical value and the first reliability value;
the third set of thresholds is selected based further on a third bit error rate associated with bits having the first logical value and the second reliability value; and
the fourth set of thresholds is selected based further on a fourth bit error rate associated with bits having the second logical value and the second reliability value.

18. An apparatus comprising:
means for selecting a first threshold in response to a value of a variable node indicating a first logical value and for selecting a second threshold in response to the value of the variable node indicating a second logical value; and
means for adjusting the value of the variable node in response to a number of unsatisfied check nodes associated with the variable node satisfying the selected threshold.

19. The apparatus of claim 18, further comprising:
means for storing a representation of a codeword; and
means for performing a bit-flipping decoding operation on the representation of the codeword read from the means for storing, the means for performing the bit-flipping decoding operation comprising:
the means for selecting; and
the means for adjusting.

20. The apparatus of claim 19, further comprising means for determining a number of unsatisfied check nodes associated with each variable node of a plurality of variable nodes, the plurality of variable nodes corresponding to bits of the representation of the codeword.

* * * * *